United States Patent
Umeda

(10) Patent No.: US 8,552,727 B2
(45) Date of Patent: Oct. 8, 2013

(54) MAGNETIC RESONANCE IMAGING APPARATUS

(75) Inventor: Masaaki Umeda, Sakura (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 297 days.

(21) Appl. No.: 13/097,493

(22) Filed: Apr. 29, 2011

(65) Prior Publication Data

US 2011/0267055 A1    Nov. 3, 2011

(30) Foreign Application Priority Data

Apr. 30, 2010  (JP) ................................. 2010-105083
Jan. 18, 2011  (JP) ................................. 2011-007865

(51) Int. Cl.
*G01V 3/00*    (2006.01)

(52) U.S. Cl.
USPC .......................................... 324/318; 324/322

(58) Field of Classification Search
USPC .......................... 324/300–322; 600/407–445
See application file for complete search history.

(56) References Cited

U.S. PATENT DOCUMENTS

| | | | | |
|---|---|---|---|---|
| 5,361,028 A | * | 11/1994 | Kanayama et al. | 324/309 |
| 6,700,375 B2 | | 3/2004 | Machida et al. | |
| 6,850,063 B2 | * | 2/2005 | Hennig | 324/314 |
| 7,075,299 B1 | * | 7/2006 | Peters | 324/309 |
| 7,141,972 B2 | * | 11/2006 | Avram et al. | 324/309 |
| 7,667,459 B2 | * | 2/2010 | Jensen et al. | 324/309 |

FOREIGN PATENT DOCUMENTS

JP    2001-161662    6/2001

* cited by examiner

*Primary Examiner* — Brij Shrivastav
(74) *Attorney, Agent, or Firm* — Nixon & Vanderhye PC

(57) ABSTRACT

According to a magnetic resonance imaging apparatus according to an embodiment, a Radio Frequency (RF) pulse applying unit applies to a subject a flip pulse for exciting spin of nuclei inside a subject body, and a flop pulse for refocusing the phase of the spin. A gradient magnetic-field applying unit applies a spoiler gradient magnetic field onto the subject after the flop pulse is applied, and applies a rewind gradient magnetic field before applying the flop pulse. A control unit executes a pulse sequence of controlling the gradient magnetic-field applying unit so as to keep each of the strengths of the spoiler gradient magnetic field and the rewind gradient magnetic field at respective predetermined values or higher with respect to each of a plurality of slice encodings.

20 Claims, 10 Drawing Sheets

MAGNETIC RESONANCE IMAGING APPARATUS

CROSS-REFERENCE TO RELATED APPLICATIONS

This application is based upon and claims the benefit of priority from Japanese Patent Application No. 2010-105083, filed on Apr. 30, 2010; and Japanese Patent Application No. 2011-007865, filed on Jan. 18, 2011, the entire contents of both of which are incorporated herein by reference.

FIELD

Embodiments described herein relate generally to a magnetic resonance imaging apparatus.

BACKGROUND

Conventionally, as an imaging method performed by a magnetic resonance imaging apparatus, there is an imaging method by using a pulse sequence of a spin echo type. According to the pulse sequence of a spin echo type, a flip pulse for exciting spin of nuclei inside a subject body, and a flop pulse for refocusing the phase of the spin are each applied to a subject.

According to such pulse sequence of a spin echo type, it is known that when a region not excited by a flip pulse is excited by a flop pulse for refocusing, an artifact is produced with a Free Induction Decay (FID) signal produced by the flop pulse. The artifact is called an FID artifact.

Generally, according to a sequence of a spin echo type, to reduce FID artifacts, a spoiler gradient magnetic field for canceling an FID signal produced by a flop pulse is applied after a flop pulse for refocusing.

However, according to conventional technologies, a spoiler gradient magnetic field with a high strength is required to remove an FID artifact. When the strength of a spoiler gradient magnetic field becomes high, a problem is produced, for example, such that it turns difficult to shorten an echo space. For this reason, it is required to acquire an image with few FID artifacts without increasing the strength of a spoiler gradient magnetic field to a large extent.

DETAILED DESCRIPTION

A magnetic resonance imaging apparatus according to an embodiment includes a Radio Frequency (RF) pulse applying unit, a gradient magnetic-field applying unit, a control unit, and an image reconstructing unit. The RF-pulse applying unit applies to a subject a flip pulse for exciting spin of nuclei inside a subject body, and a flop pulse for refocusing the phase of the spin. The gradient magnetic-field applying unit applies a spoiler gradient magnetic field onto the subject after the flop pulse is applied, and applies a rewind gradient magnetic field before applying the flop pulse. When performing imaging by three-dimensional fast spin echo method, the control unit executes a pulse sequence of controlling the gradient magnetic-field applying unit so as to keep each of the strengths of the spoiler gradient magnetic field and the rewind gradient magnetic field equal to or higher than a predetermined value with respect to each of a plurality of slice encodings. The image reconstructing unit reconstructs an image from magnetic resonance data collected by executing the pulse sequence.

A magnetic resonance imaging apparatus according to embodiments will be explained below in detail with reference to the accompanying drawings. Hereinafter, the magnetic resonance imaging apparatus is referred to as the MRI apparatus.

Figure 1:
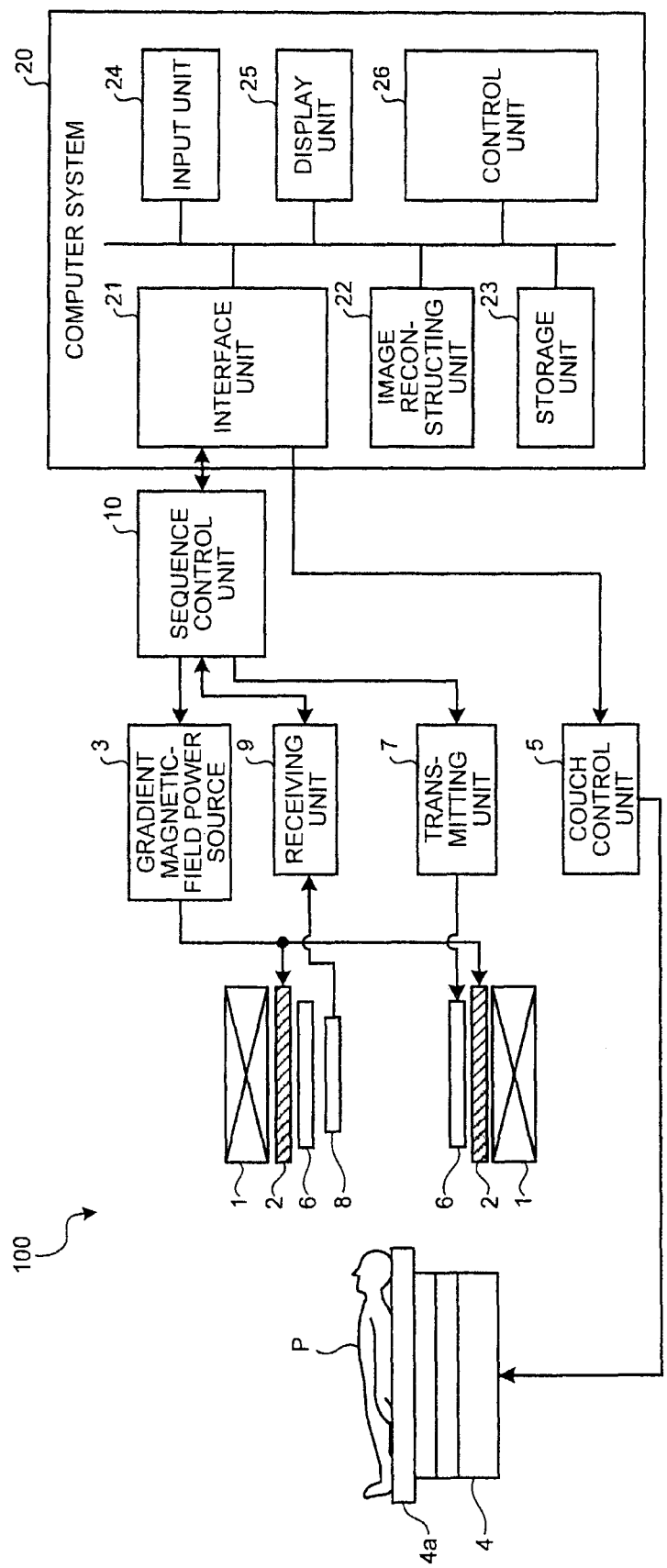
FIG. 1 is a schematic diagram that depicts a configuration of a Magnetic Resonance Imaging (MRI) apparatus according to a first embodiment.

First of all, a first embodiment is explained below. FIG. 1 is a schematic diagram that depicts a configuration of an MRI apparatus according to the first embodiment. As shown in FIG. 1, an MRI apparatus 100 includes a static magnetic-field magnet 1, a gradient coil 2, a gradient magnetic-field power source 3, a couch 4, a couch control unit 5, a transmitting RF coil 6, a transmitting unit 7, a receiving RF coil 8, a receiving unit 9, a sequence control unit 10, and a computer system 20.

The static magnetic-field magnet 1 is a magnet formed in a hollow drum shape, and generates a uniform static magnetic field in a space in its inside. As the static magnetic-field magnet 1, for example, a permanent magnet or a super conducting magnet is used.

The gradient coil 2 is a coil formed in a hollow drum shape, and is arranged on the inner side of the static magnetic-field magnet 1. The gradient coil 2 is formed of three coils in combination corresponding to x, y, and z axes orthogonal to one another, and the three coils generate respective gradient magnetic fields of which magnetic field strengths vary along the x, y, and z axes, respectively, by individually receiving a current supply from the gradient magnetic-field power source 3, which will be described later. It is assumed that the z axis direction is the same direction as that of the static magnetic field. The gradient magnetic-field power source 3 supplies a current to the gradient coil 2.

The gradient magnetic fields of the x, y, and z axes generated by the gradient coil 2 correspond to, for example, a slice-selective gradient magnetic field Gs, a phase-encoding gradient magnetic field Ge, and a readout gradient magnetic field Gr, respectively. The slice-selective gradient magnetic field Gs is used for arbitrarily setting a scan cross section. The phase-encoding gradient magnetic field Ge is used for changing the phase of a magnetic resonance signal in accordance with a spatial position. The readout gradient magnetic field Gr is used for changing the frequency of a magnetic resonance signal in accordance with a spatial position.

The couch 4 includes a couchtop 4a on which a subject P is to be placed; and under the control of the couch control unit 5, which will be described later, the couch 4 inserts the couchtop 4a on which the subject P is placed, into a hole (a scanning space) of the gradient coil 2. Usually, the couch 4 is placed such that the longitudinal direction of the couch 4 is to be parallel to the central axis of the static magnetic-field magnet 1. The couch control unit 5 is a device that controls the couch 4 under the control of a control unit 26, and moves the couchtop 4a in the longitudinal direction and upward and downward by driving the couch 4.

The transmitting RF coil 6 is arranged on the inner side of the gradient coil 2, and generates a radio-frequency magnetic field by receiving supply of a radio-frequency pulse from the transmitting unit 7. The transmitting unit 7 transmits a radio-frequency pulse corresponding to a Larmor frequency to the transmitting RF coil 6. The receiving RF coil 8 is arranged on the inner side of the gradient coil 2, and receives a magnetic resonance signal emitted from the subject P owing to an influence of the radio-frequency magnetic field described above. Upon receiving a magnetic resonance signal, the receiving RF coil 8 outputs the magnetic resonance signal to the receiving unit 9.

The receiving unit 9 creates raw data (magnetic resonance data) based on the magnetic resonance signal output by the receiving RF coil 8. The receiving unit 9 creates raw data by converting the magnetic resonance signal output by the receiving RF coil 8 to digital. The raw data is associated with information about spatial frequencies in a Phase encoding (PE) direction, a Read Out (RO) direction, and a Slice Encoding (SE) direction by the slice-selective gradient magnetic field Gs, the phase-encoding gradient magnetic field Ge, and the readout gradient magnetic field Gr, and is arranged in a k-space. After creating the raw data, the receiving unit 9 transmits the raw data to the sequence control unit 10.

The sequence control unit 10 performs a scan of the subject P by activating the gradient magnetic-field power source 3, the transmitting unit 7, and the receiving unit 9, based on sequence execution information transmitted from the computer system 20. The sequence execution information is information that defines a pulse sequence describing a procedure for executing a scan of the subject P, such as the strength of power to be supplied to the gradient coil 2 by the gradient magnetic-field power source 3 and the timing of supplying the power, the strength of a RF signal to be transmitted to the transmitting RF coil 6 by the transmitting unit 7 and the timing of transmitting the radio-frequency signal, and the timing of detecting a magnetic resonance signal by the receiving unit 9.

When the raw data is transmitted from the receiving unit 9 as a result of activating the gradient magnetic-field power source 3, the transmitting unit 7, and the receiving unit 9 based on the sequence execution information, and consequently, the sequence control unit 10 transfers the raw data to the computer system 20.

The computer system 20 performs overall control of the MRI apparatus 100. For example, the computer system 20 performs a scan of the subject P and image reconstruction by activating each unit included in the MRI apparatus 100. The computer system 20 includes an interface unit 21, an image reconstructing unit 22, a storage unit 23, an input unit 24, a display unit 25, and the control unit 26.

The interface unit 21 controls input and output of various signals that are given and received to and from the sequence control unit 10. For example, the interface unit 21 transmits sequence execution information to the sequence control unit 10, and receives raw data from the sequence control unit 10. When having received raw data, the interface unit 21 stores each raw data into the storage unit 23 with respect to each subject P.

The image reconstructing unit 22 creates spectrum data of a desired nuclear spin inside the subject P or image data, by performing post-processing, i.e., reconstruction processing, such as Fourier transform processing, on raw data stored by the storage unit 23. The storage unit 23 stores raw data received by the interface unit 21, and spectrum data and image data created by the image reconstructing unit 22, with respect to each subject P.

The input unit 24 receives various instructions and information input from an operator. As the input unit 24, a pointing device, such as a mouse or a trackball, a selecting device, such as a mode switch, and an input device, such as a keyboard, can be used as required. The display unit 25 displays various information, such as spectrum data or image data, under the control of the control unit 26. A display device, such as a liquid crystal display, can be used as the display unit 25.

The control unit 26 includes a Central Processing Unit (CPU) and a memory, both of which are not shown, and carries out overall control of the MRI apparatus 100. The control unit 26 creates various kinds of sequence execution information based on imaging conditions input by the operator via the input unit 24, and transmits the created sequence execution information to the sequence control unit 10, thereby controlling a scan. Moreover, the control unit 26 controls the image reconstructing unit 22 so as to reconstruct an image based on raw data when the raw data is transmitted from the sequence control unit 10 as a result of the scan.

A configuration of the MRI apparatus 100 according to the first embodiment is explained above. Under such configuration, the MRI apparatus 100 is configured such that when performing imaging by a three-dimensional Fast Spin Echo (FSE 3D) method using a pulse sequence of a fast spin echo type of taking a three-dimensional image, an image with few Free Induction Decay (FID) artifacts can be acquired without increasing the strength of the spoiler gradient magnetic field by a large extent.

Conventionally, it is known that according to a pulse sequence of a spin echo type, an FID artifact is produced when a region that is not subjected to excitation by a flip pulse is subjected to excitation by a flop pulse. Particularly, in a case of a 3D sequence of which selected region is thick, FID artifacts are notably produced. Moreover, FID artifacts are produced due to magnetic-field ununiformity, and notably appear in a high magnetic field MRI in which transmission irregularity of RF pulse tends to be produced (for example, MRI using a magnetic field of 3 tesla).

As described above, because FID artifacts notably appear through a 3D sequence or in a high magnetic field MRI, a spoiler gradient magnetic field with a high strength is required in order to remove FID artifact. However, if using a spoiler gradient magnetic field with a high strength, resolution in the slice direction is limited, and an echo space cannot be shortened. For this reason, it is desired to reduce FID artifact without applying a spoiler gradient magnetic field with a high strength.

Moreover, according to the FSE 3D method, slice encodings of a plurality of number of times are executed in the slice encoding direction. In each slice encoding, a flip pulse (90-degree pulse) for exciting spin of nuclei inside the subject body is applied onto a subject, and then a flop pulse (180-degree pulse) for refocusing the phase of the spin is applied a plurality of number of times. Moreover, after the application of the flop pulse, a spoiler gradient magnetic field for cancelling an FID signal produced by the flop pulse is applied. Furthermore, before application of the flop pulse, a rewind gradient magnetic field for cancelling a slice encoding by a slice-encoding gradient magnetic field is applied.

Such FSE 3D method includes for example, a constant flop-spoiling method, and a variable flop-spoiling method. The constant flop-spoiling method is a method of keeping the strength of the spoiler gradient magnetic field at a constant value regardless of a slice-encoding volume. The variable flop-spoiling method is a method of varying the strength of the spoiler gradient magnetic field in an interlocked manner with a slice-encoding volume. A method in which the strength of the spoiler gradient magnetic field is zero is called a no-spoiling method.

Figure 2:
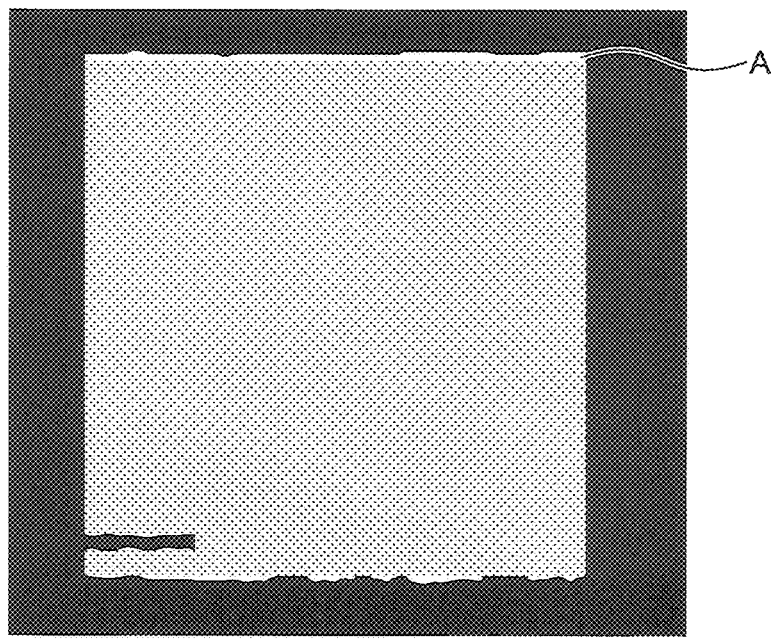
FIGS. 2 and 3 are schematic diagrams each of which depicts an example of an image taken by a conventional three-dimensional Fast Spin Echo (FSE 3D) method.
Figure 3:
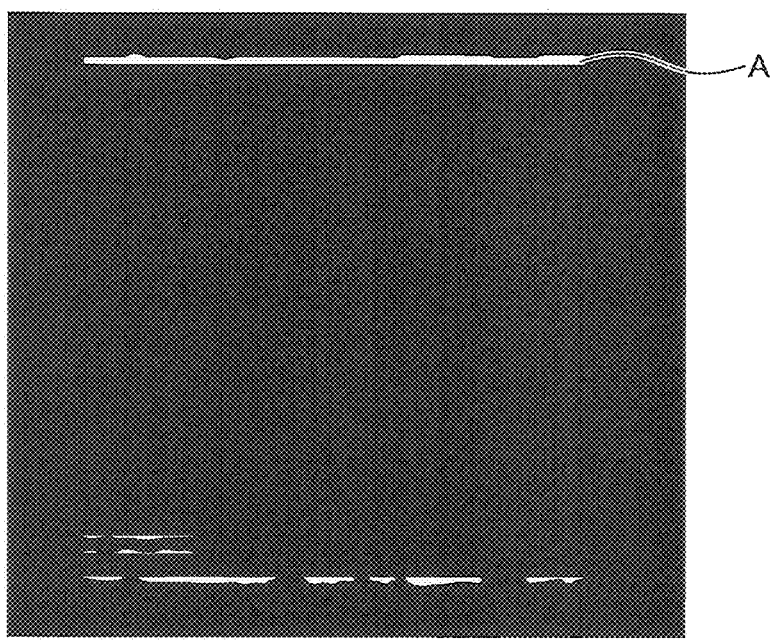

FIGS. 2 and 3 are schematic diagrams each of which depicts an example of an image taken by a conventional FSE 3D method. Each of FIGS. 2 and 3 is an image of a rectangular phantom taken by the constant flop-spoiling method, and FIG. 3 depicts an image when imaging without applying a flip pulse. As shown in FIG. 2, an FID artifact A is sometimes produced on an image taken by the constant flop-spoiling method in some cases. Moreover, as shown in FIG. 3, only the FID artifact A is rendered on an image that is taken without applying a flip pulse. On the image shown in FIG. 2, the FID artifact A corresponding to the image in FIG. 3 is produced. Sometimes an FID artifact is similarly produced also on an image taken by the variable flop-spoiling method in some cases.

Figure 4:
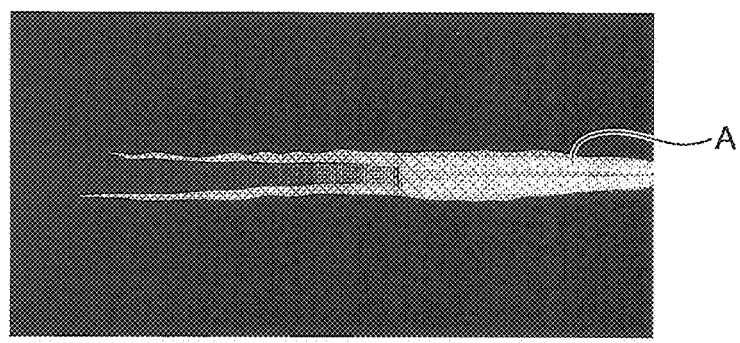
FIGS. 4 and 5 are schematic diagrams each of which depicts raw data corresponding to different slice encoding among raw data of the image shown in FIG. 3.
Figure 5:
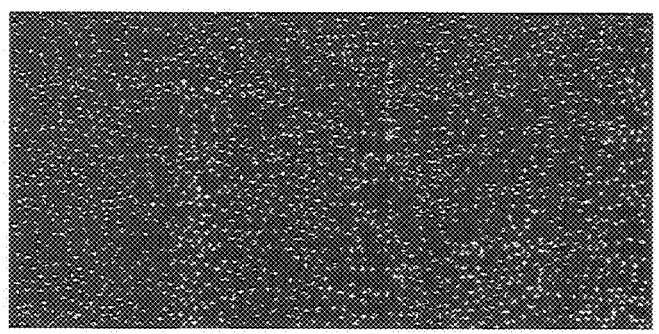

FIGS. 4 and 5 are schematic diagrams each of which depicts raw data corresponding to different slice encoding among raw data of the image shown in FIG. 3. The raw data shown in FIGS. 4 and 5 are those collected by the constant flop-spoiling method. In other words, the raw data shown in FIG. 4 and the raw data shown in FIG. 5 are the same in terms of the strength of the spoiler gradient magnetic field applied at the moment of collection, but different in the strength of the rewind gradient magnetic field.

Specifically, the raw data shown in FIG. 4 is data by slice encoding of which rewind gradient magnetic field is set to zero, and an artifact A is produced. Raw data shown in FIG. 5 is data that is collected as the rewind gradient magnetic field is set with a predetermined strength. In other words, whether an FID artifact is produced depends on the strength of the rewind gradient magnetic field as well as the strength of the spoiler gradient magnetic field.

Figure 6:
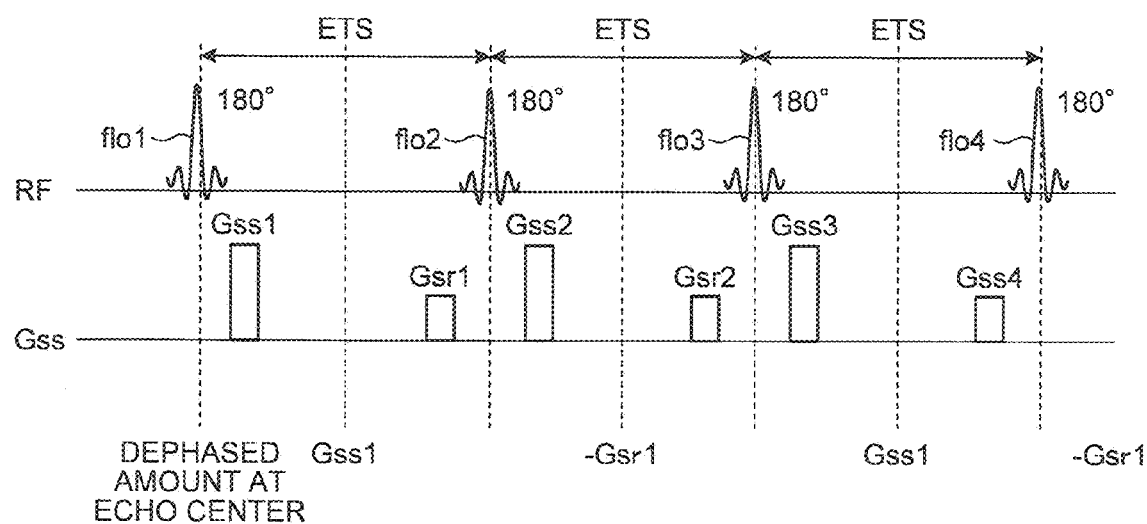
FIG. 6 is a schematic diagram that depicts an example of a pulse sequence used by the conventional FSE 3D method.

FIG. 6 is a schematic diagram that depicts an example of a pulse sequence used by the conventional FSE 3D method. FIG. 6 depicts a pulse sequence corresponding to certain slice encoding. The pulse sequence shown in FIG. 6 depicts pulse sequences of a first flop pulse flo1 and subsequent ones. For the purpose of simplifying descriptions, a flip pulse to be applied at first, a readout gradient magnetic field, a phase-encoding gradient magnetic field, and a slice-selective gradient magnetic field are not shown in FIG. 6.

As shown in FIG. 6, according to a pulse sequence corresponding to certain slice encoding, a spoiler gradient magnetic field and a rewind gradient magnetic field are applied in the slice encoding direction. It is assumed here that Gss1 denotes the strength of a spoiler gradient magnetic field, and Gsr1 denotes the strength of a rewind gradient magnetic field, corresponding to the first flop pulse flo1. Moreover, where Gssi denotes the strength of a spoiler gradient magnetic field, and Gsri denotes the strength of a rewind gradient magnetic field, corresponding to an i-th flop pulse floi, Gssi=Gss1, and Gsri=Gsr1. Furthermore, where Gsdi denotes a dephased amount of a gradient magnetic field at an i-th echo time (echo center), when an application time of the phase-encoding gradient magnetic field is omitted as it is 1, Gsd1=Gss1.

When it is considered that a component of an FID artifact is reversed by a flop pulse, Gsd2=−(Gss1+Gsr1)+Gss1=−Gsr1, and Gsd3=Gss1. In other words, as shown in FIG. 6, dephased amounts are repeated such that Gss1, −Gsr1, Gss1, −Gsr1, and so on. As a result, when Gss1 or Gsr1 becomes zero, an FID artifact is rephased, so that it has a strong strength.

For example, where Gss1=Gsr1 according to a 2D sequence, dephased amounts are repeated as Gss1, −Gsr1, Gss1, −Gsr1, and so on, therefore an FID artifact depends only on the strength of the spoiler gradient magnetic field. However, according to a 3D sequence, generally Gss1 is different from Gsr1. Therefore, according to the 3D sequence, it is desirable that each of Gss1 and Gsr1 has the strength equal to or higher than a predetermined value. Here, the predetermined value is a value except zero.

Figure 7:
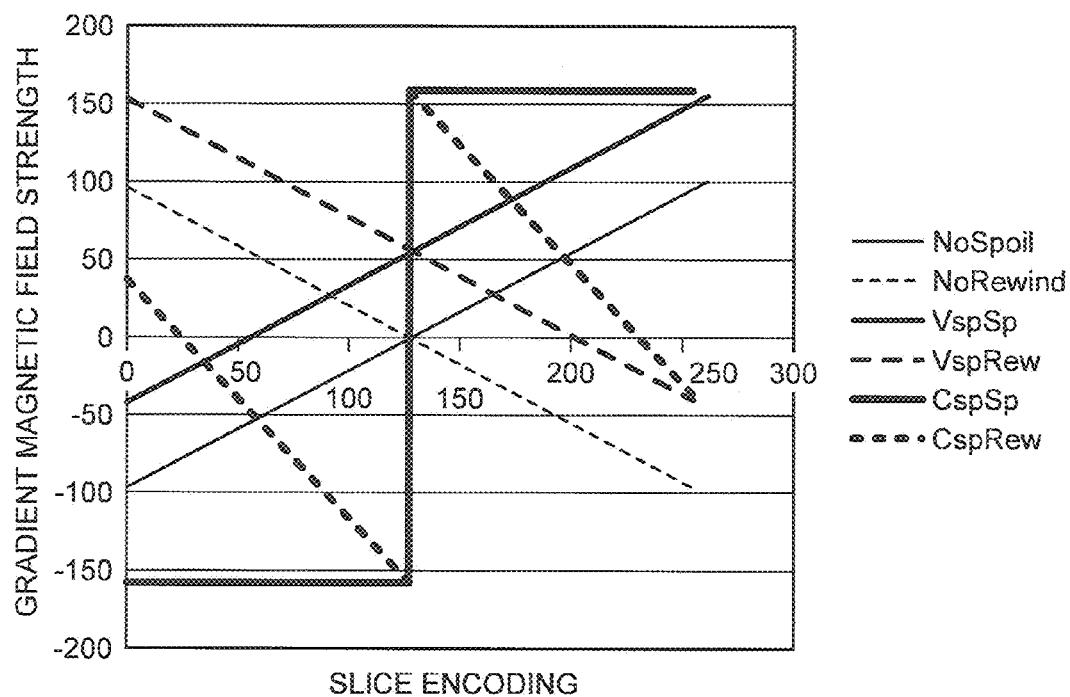
FIG. 7 is a schematic diagram that depicts an example of control of a spoiler gradient magnetic field and a rewind gradient magnetic field according to the conventional FSE 3D method.

FIG. 7 is a schematic diagram that depicts an example of control of a spoiler gradient magnetic field and a rewind gradient magnetic field according to the conventional FSE 3D method. A vertical axis in FIG. 7 indicates the strength of the gradient magnetic fields, and a horizontal axis indicates slice encoding. According to FIG. 7, the gradient magnetic field strength shown on the vertical axis is with reference to the maximum strength of a slice-encoding gradient magnetic field when the strength of the spoiler gradient magnetic field is set zero, and is expressed in a proportion to the maximum strength of the slice-encoding gradient magnetic field. The maximum strength of the slice-encoding gradient magnetic field is determined in accordance with imaging conditions that are set at the time of imaging.

In FIG. 7, the thinnest solid line (NoSpoil) indicates the strength of a slice-encoding gradient magnetic field by the no-spoiling method, and the thinnest broken line (NoRewind) indicates the strength of a rewind gradient magnetic field by the no-spoiling method. Moreover, the second thinnest solid line (VspSp) indicates the strength of a spoiler gradient magnetic field by the variable flop-spoiling method, and the second thinnest broken line (VspRew) indicates the strength of a rewind gradient magnetic field by the variable flop-spoiling method. Furthermore, the thickest solid line (CspSp) indicates the strength of a spoiler gradient magnetic field by the constant flop-spoiling method, and the thickest broken line (CspRew) indicates the strength of a rewind gradient magnetic field by the constant flop-spoiling method.

It is assumed in the example shown in FIG. 7 that the maximum strength of the spoiler gradient magnetic field by the variable flop-spoiling method and the constant flop-spoiling method is, for example, 160% of the maximum strength of the slice-encoding gradient magnetic field by the no-spoiling method.

As shown in FIG. 7, according to the variable flop-spoiling method, each of the strength of the spoiler gradient magnetic field and the strength of the rewind gradient magnetic field becomes zero once. Moreover, according to the constant flop-spoiling method, the strength of the rewind gradient magnetic field becomes zero twice.

In this example, in order to prevent the strength of the spoiler gradient magnetic field and the strength of the rewind gradient magnetic field from both becoming zero by the variable flop-spoiling method and the constant flop-spoiling method, the maximum strength of the spoiler gradient magnetic field needs to be 200% or higher of the maximum strength of the slice-encoding gradient magnetic field by the no-spoiling method.

However, as described above, setting a high strength of the spoiler gradient magnetic field may result in limitations on a pulse sequence such that a resolution in the slice direction is limited, and an echo space cannot be shortened. In order to avoid such phenomenon, when performing imaging by the FSE 3D method, according to the MRI apparatus 100 of the first embodiment, the control unit 26 controls the gradient coil 2 so as to keep each of the strength of the spoiler gradient magnetic field and the strength of the rewind gradient magnetic field equal to or higher than a predetermined value, with respect to each of a plurality of slice encodings.

For example, the control unit 26 keeps each of the strength of the spoiler gradient magnetic field and the strength of the rewind gradient magnetic field equal to or higher than a predetermined value by performing a scan of the subject P by a hybrid spoiling method that the no-spoiling method and the constant flop-spoiling method are combined. Specifically, the control unit 26 creates sequence execution data that defines a procedure of a scan by the hybrid spoiling method, and transmits the sequence execution data to the sequence control unit 10, thereby causing it to execute a scan by the hybrid spoiling method.

Figure 8:
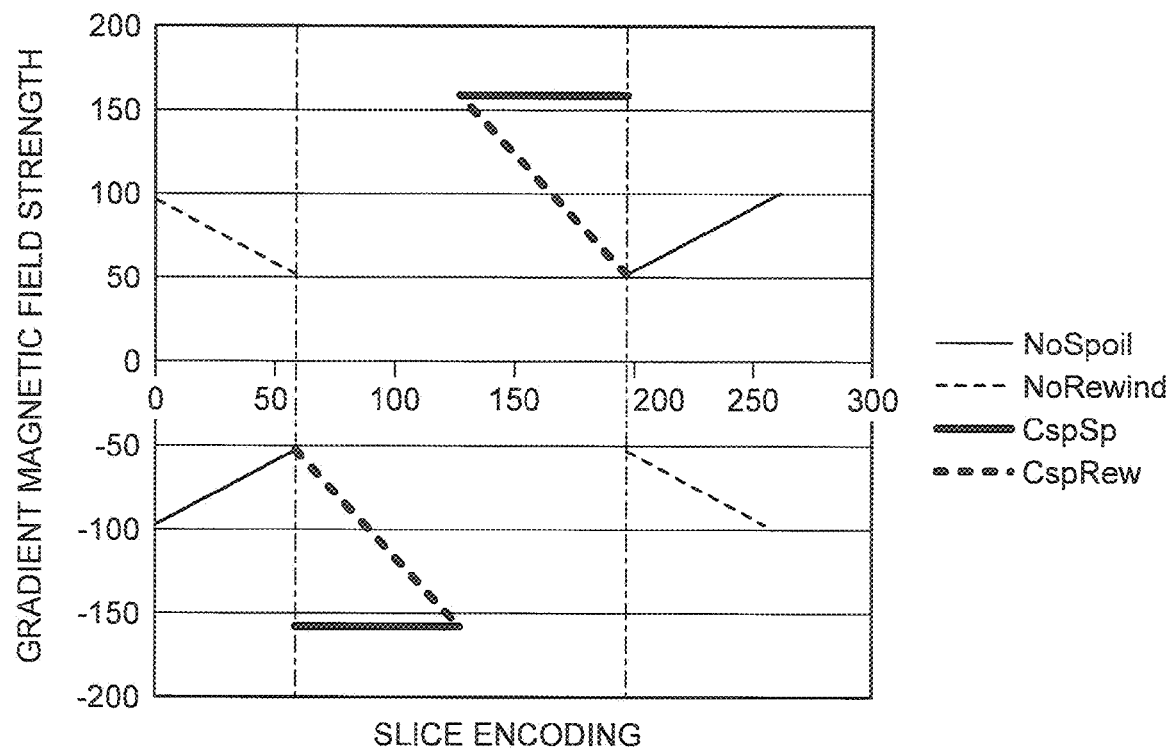
FIG. 8 is a schematic diagram that depicts control of a spoiler gradient magnetic field and a rewind gradient magnetic field by a hybrid spoiling method according to the first embodiment.

FIG. 8 is a schematic diagram that depicts control of a spoiler gradient magnetic field and a rewind gradient magnetic field by the hybrid spoiling method according to the first embodiment. FIG. 8 depicts part of the strength of a slice-encoding gradient magnetic field (NoSpoil) and the strength of a rewind gradient magnetic field (NoRewind) by the no-spoiling method, and the strength of a spoiler gradient magnetic field by the constant flop-spoiling method (CspSp) and the strength of a rewind gradient magnetic field (CspRew) by the constant flop-spoiling method (CspRew), which are shown in FIG. 6.

As shown in FIG. 8, when performing imaging by the FSE 3D method, the control unit 26 creates sequence execution data such that a pulse sequence by the no-spoiling method and a pulse sequence by the constant flop-spoiling method can be switched during slice encoding that the strength of the slice-encoding gradient magnetic field by the no-spoiling method (NoSpoil) matches with the strength of the rewind gradient magnetic field by the constant flop-spoiling method (CspRew).

The control unit 26 then transmits the created sequence execution data of the hybrid spoiling method to the sequence control unit 10. The sequence control unit 10 that has received the sequence execution data activates the gradient magnetic-field power source 3, the transmitting unit 7, and the receiving unit 9 based on the sequence execution data. Accordingly, the transmitting RF coil 6 applies a flip pulse for exciting spin of nuclei inside the subject P, and a flop pulse for refocusing the phase of the spin, onto the subject P. Moreover, the gradient coil 2 applies a spoiler gradient magnetic field onto the subject P after the application of the flop pulse, and applies a rewind gradient magnetic field before applying the flop pulse. At that time the gradient coil 2 is controlled so as to keep each of the strength of the spoiler gradient magnetic field and the strength of the rewind gradient magnetic field at equal to or higher than a predetermined value, with respect to each of slice encodings.

In other words, as shown in FIG. 8, a scan by the no-spoiling method is performed until a slice encoding that the strength of the slice-encoding gradient magnetic field by the no-spoiling method (NoSpoil) matches with the strength of the rewind gradient magnetic field by the constant flop-spoiling method (CspRew), and then a scan by the constant flop-spoiling method is performed afterward. After that, a scan by the constant flop-spoiling method is performed until a slice encoding that the strength of the slice-encoding gradient magnetic field by the no-spoiling method (NoSpoil) again matches with the strength of the rewind gradient magnetic field by the constant flop-spoiling method (CspRew), and then a scan by the no-spoiling method is performed afterward.

Accordingly, the strength of the spoiler gradient magnetic field and the strength of the rewind gradient magnetic field can be both kept equal to or higher than a predetermined value in slice encoding at any position.

Figure 9:
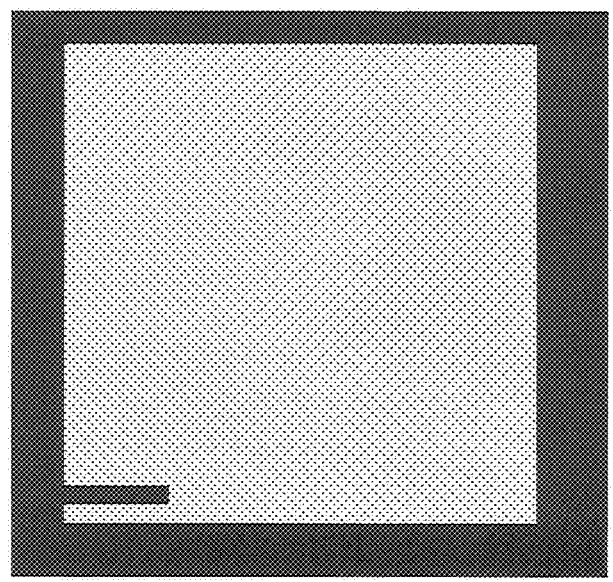
FIGS. 9 and 10 are schematic diagrams each of which depicts an example of an image taken by the hybrid spoiling method according to the first embodiment.
Figure 10:
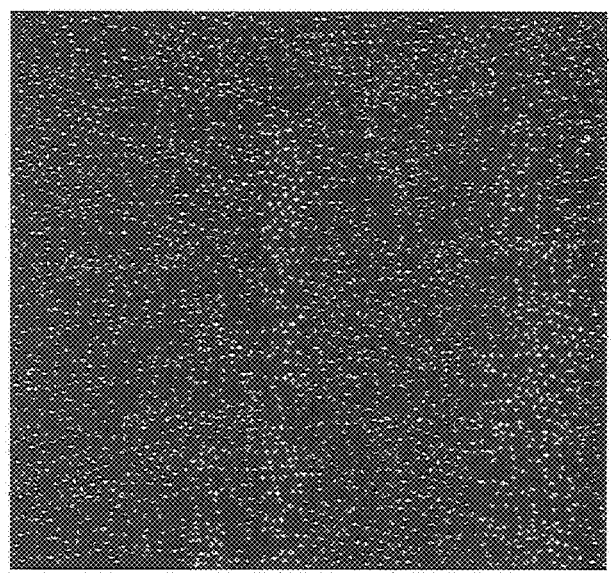

FIGS. 9 and 10 are schematic diagrams each of which depicts an example of an image taken by the hybrid spoiling method according to the first embodiment. Each of FIGS. 9 and 10 is an image of a rectangular phantom that is taken by the hybrid spoiling method according to the first embodiment, and FIG. 9 depicts an image in a case of imaging without applying flip pulse. As shown in FIG. 9, on the image taken by the hybrid spoiling method according to the first embodiment, the FID artifact A rendered on the images FIGS. 2 and 3 are removed.

The control unit 26 can be configured so as to execute a pulse sequence of controlling the gradient coil 2 so as to keep the strengths of the spoiler gradient magnetic field and the rewind gradient magnetic field equal to or higher than a predetermined value with respect to each of a plurality of slice encodings, when the maximum strength of the spoiler gradient magnetic field or the rewind gradient magnetic field is less than 200% of the maximum strength of the slice-encoding gradient magnetic field during imaging by the FSE 3D method.

Figure 11:
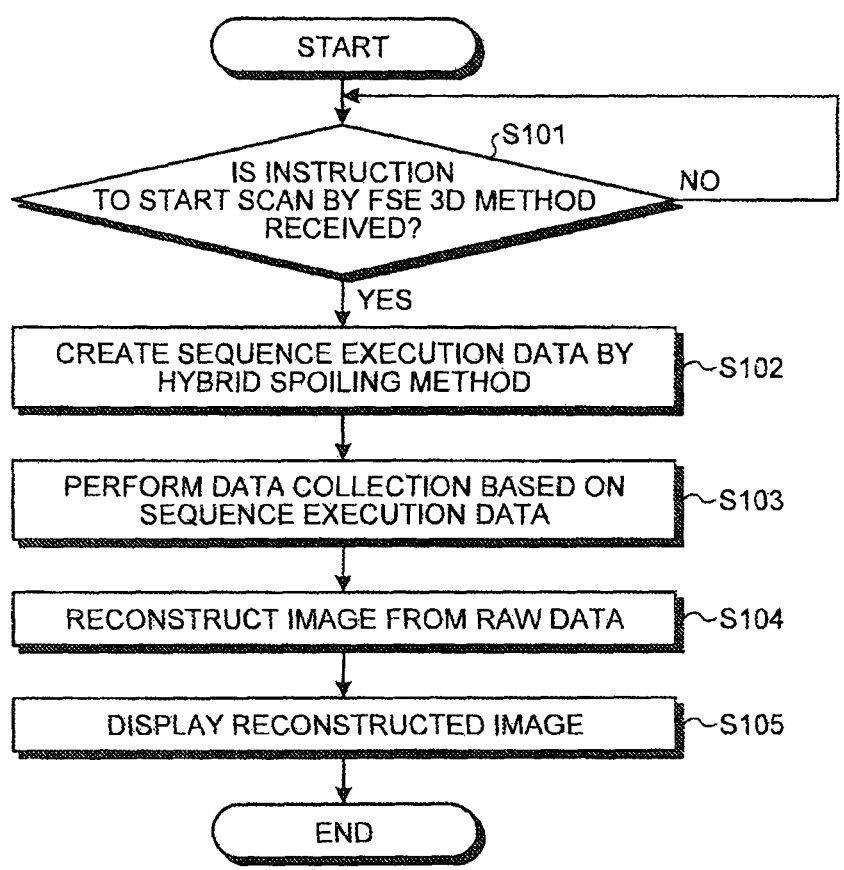
FIG. 11 is a flowchart that depicts an operation procedure of the MRI apparatus according to the first embodiment.

An operation procedure of the MRI apparatus 100 according to the first embodiment is then explained below. FIG. 11 is a flowchart that depicts an operation procedure of the MRI apparatus 100 according to the first embodiment.

As shown in FIG. 11, according to the MRI apparatus 100 of the first embodiment, when an instruction to start a scan by the FSE 3D method is received from an operator (Yes at Step S101); the control unit 26 creates sequence execution data of the hybrid spoiling method that the no-spoiling method and the constant flop-spoiling method are combined (Step S102).

Subsequently, the sequence control unit 10 performs data collection by activating the gradient magnetic-field power source 3, the transmitting unit 7, and the receiving unit 9 based on the sequence execution data created by the control unit 26 (Step S103).

The image reconstructing unit 22 then reconstructs an image from the collected raw data (Step S104). The control unit 26 then causes the display unit 25 to display the image reconstructed by the image reconstructing unit 22 (Step S105).

As described above, according to the first embodiment, the transmitting RF coil 6 applies a flip pulse for exciting spin of nuclei inside the subject P and a flop pulse for refocusing the phase of the spin onto the subject P. The gradient coil 2 applies a spoiler gradient magnetic field onto the subject P after the application of the flop pulse, and applies a rewind gradient magnetic field before applying the flop pulse. When performing imaging by the FSE 3D method, the control unit 26 executes a pulse sequence of controlling the gradient coil 2 so as to keep the strengths of the spoiler gradient magnetic field and the rewind gradient magnetic field equal to or higher than a predetermined value with respect to each of a plurality of slice encodings. The image reconstructing unit 22 then reconstructs an image from the raw data that is collected by executing the pulse sequence. Accordingly, according to the first embodiment, an image with few FID artifacts can be acquired without increasing the strength of a spoiler gradient magnetic field by a large extent. Moreover, because the strength of the spoiler gradient magnetic field does not need to be increased by a large extent, an echo space can be shortened. If an echo space is not changed, an image thinner in slice thickness can be acquired.

Moreover, according to the first embodiment, the control unit 26 executes a scan during which the no-spoiling method and the constant flop-spoiling method are switched during slice encoding in which the strength of a slice-encoding gradient magnetic field when the strength of the spoiler gradient magnetic field is zero matches with the strength of a rewind gradient magnetic field when the strength of the spoiler gradient magnetic field is constant, thereby keeping the strengths of the spoiler gradient magnetic field and the rewind gradient magnetic field equal to or higher than a predetermined value. Accordingly, according to the first embodiment, an image with few FID artifacts can be easily acquired by using a conventional imaging method.

A second embodiment is explained below. The second embodiment explains a case where the MRI apparatus executes a prescan that collects magnetic resonance data without applying flip pulse, and subtracts raw data collected by the prescan from raw data collected by the hybrid spoiling method explained in the first embodiment, thereby reducing FID artifacts more.

Figure 12:
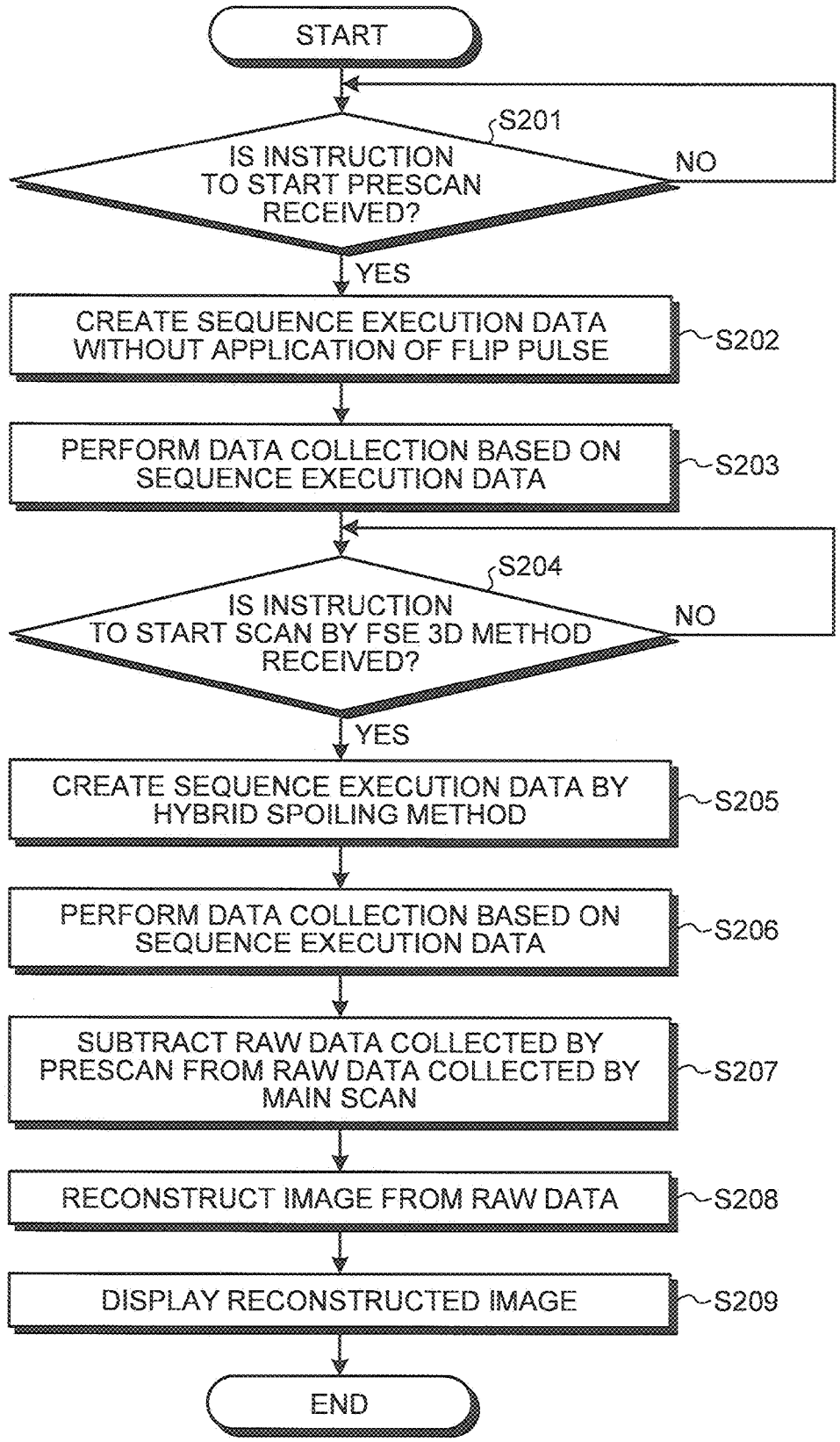
FIG. 12 is a flowchart that depicts an operation procedure of an MRI apparatus according to a second embodiment.

Because a configuration of an MRI apparatus according to the second embodiment is the same as that shown in FIG. 1, an operation procedure of the MRI apparatus according to the second embodiment is explained below. FIG. 12 is a flowchart that depicts an operation procedure of the MRI apparatus 100 according to the second embodiment.

As shown in FIG. 12, according to the MRI apparatus 100 of the second embodiment, when an instruction to start a prescan is received from an operator (Yes at Step S201); the control unit 26 creates sequence execution data for collecting data of slice encoding in which the strength of the spoiler gradient magnetic field or the rewind gradient magnetic field in a pulse sequence by the FSE 3D method becomes a minimum without applying flip pulse (Step S202).

Subsequently, the sequence control unit 10 performs data collection by activating the gradient magnetic-field power source 3, the transmitting unit 7, and the receiving unit 9 based on the sequence execution data created by the control unit 26 (Step S203).

In this way, by collecting raw data of slice encoding in which the strength of the spoiler gradient magnetic field or the rewind gradient magnetic field becomes a minimum without applying flip pulse, raw data that includes components of an FID signal produced by a flop pulse most is collected.

After that, when an instruction to start a scan by the FSE 3D method from the operator (Yes at Step S204); the control unit 26 creates sequence execution data of the hybrid spoiling method that the no-spoiling method and the constant flop-spoiling method are combined (Step S205).

Subsequently, the sequence control unit 10 performs data collection data by activating the gradient magnetic-field power source 3, the transmitting unit 7, and the receiving unit 9 based on the sequence execution data created by the control unit 26 (Step S206).

The image reconstructing unit 22 performs subtraction processing of subtracting the raw data collected by the prescan from the raw data collected by the main scan by the hybrid spoiling method (Step S207); and then reconstructs an image from the data obtained by the subtraction processing (Step S208).

In this way, components of an FID signal that cause an FID artifact are removed from the raw data collected by the main scan with respect to slice encoding of which strength of the spoiler gradient magnetic field or the rewind gradient magnetic field becomes a minimum, by subtracting the raw data collected by the prescan from the raw data collected by the main scan by the hybrid spoiling method. Accordingly, an image with few FID artifacts can be obtained.

The control unit 26 then causes the display unit 25 to display the image reconstructed by the image reconstructing unit 22 (Step S209).

As described above, according to the second embodiment, the control unit 26 executes a prescan that collects magnetic resonance data of slice encoding of which the strength of the spoiler gradient magnetic field or the rewind gradient magnetic field in a pulse sequence by the FSE 3D method becomes a minimum without applying flip pulse. The image reconstructing unit 22 performs subtraction processing of subtracting the raw data collected by the prescan from the raw data collected by the main scan by the FSE 3D method, and then reconstructs an image from the data obtained by the subtraction processing. Accordingly, according to the second embodiment, an image with few FID artifacts can be obtained.

The method, explained in the second embodiment, of subtracting raw data collected by a prescan without applying flip pulse from raw data collected by the FSE 3D method does not need to be performed by being combined with the hybrid spoiling method explained in the first embodiment. For example, the method explained in the second embodiment can be performed by being combined with the constant flop-spoiling method or the variable flop-spoiling method. Alternatively, it can be performed by being combined with a two-dimensional spin echo method, or a two-dimensional fast spin echo method.

The second embodiment explains above a case of collecting data by a prescan without applying flip pulse. In addition to this, for example, a prescan can collect data corresponding to the vicinity of the center of a k-space by shifting a tune amount of a gradient magnetic field after application of a flip pulse. Moreover, for example, a prescan can collect data of slice encoding of which the strength of the spoiler gradient magnetic field or the rewind gradient magnetic field is small, by shifting a tune amount of the gradient magnetic field after application of a flip pulse.

According to the first and the second embodiments, cases of using a pulse sequence by the hybrid spoiling method that the no-spoiling method and the constant flop-spoiling method are combined are explained, however, embodiments are not limited to these. In other words, other pulse sequences can be used on condition that the pulse sequence can keep the strengths of the spoiler gradient magnetic field and the rewind gradient magnetic field equal to or higher than a predetermined value with respect to each of the slice encodings.

Figure 13:
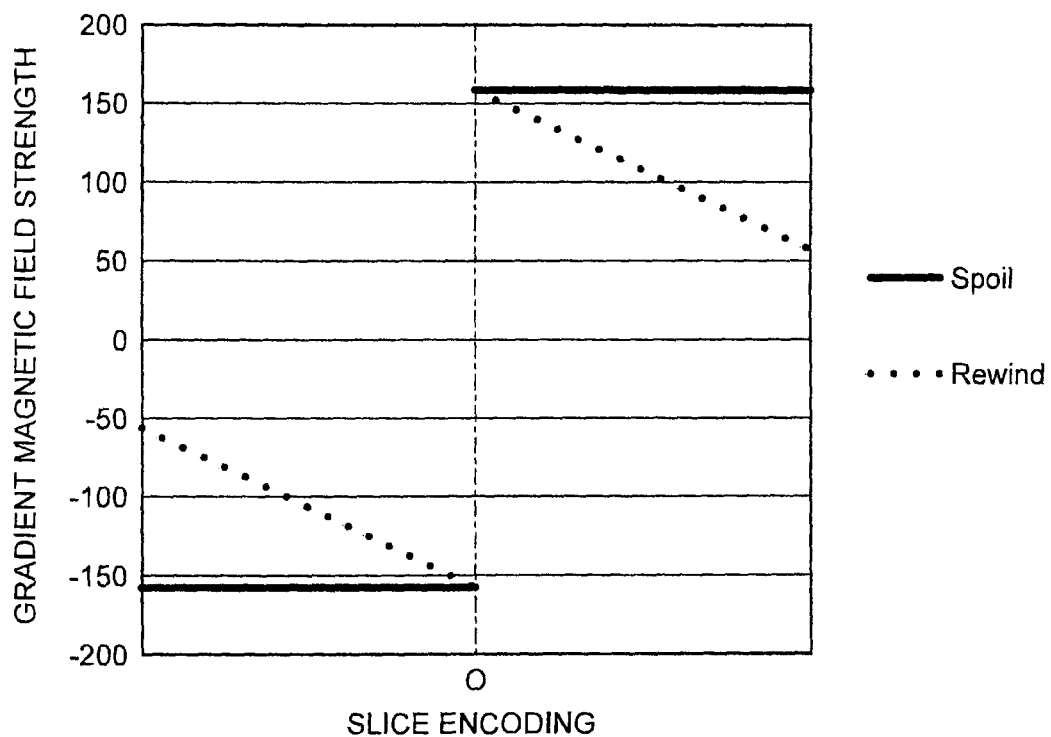
FIGS. 13 to 15 are schematic diagrams each of which depicts control of a spoiler gradient magnetic field and a rewind gradient magnetic field through a pulse sequence according to other embodiments.
Figure 14:
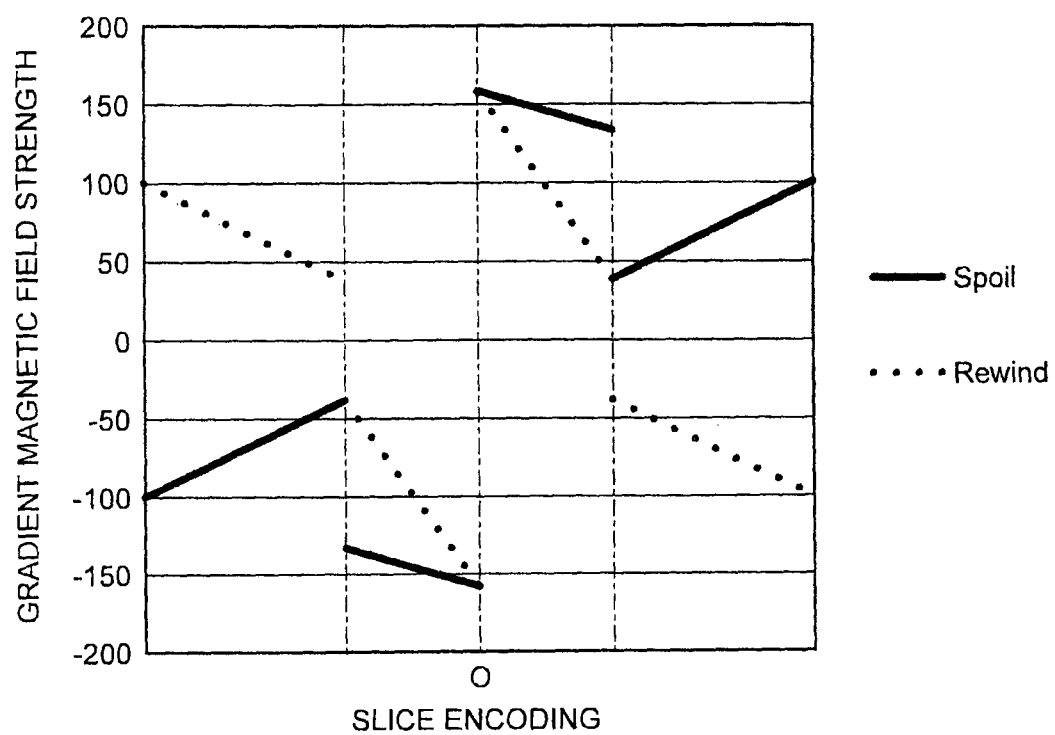
Figure 15:
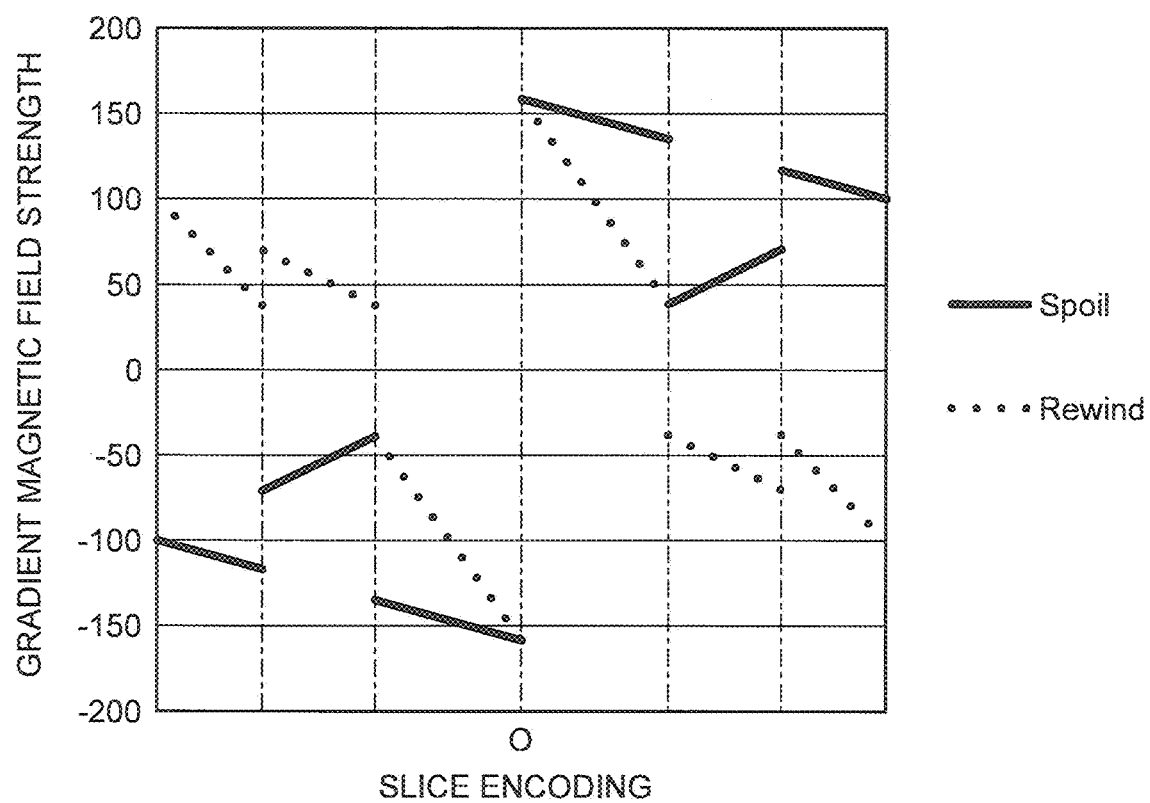

FIGS. 13 to 15 are schematic diagrams each of which depicts control of a spoiler gradient magnetic field and a rewind gradient magnetic field through a pulse sequence according to other embodiments. Each of FIGS. 13 to 15 depicts a spoiler gradient magnetic field and a rewind gradient magnetic field used by the FSE 3D method. In FIGS. 13 to 15, the vertical axis indicates the strength of the gradient magnetic fields, and the horizontal axis indicates slice encoding. A solid line (Spoil) indicates the strength of a spoiler gradient magnetic field, a broken line (Rewind) indicates the strength of a rewind gradient magnetic field. The gradient magnetic field strength shown on the vertical axis is expressed in a proportion to the maximum strength of a slice-encoding gradient magnetic field. The maximum strength of the slice-encoding gradient magnetic field is determined in accordance with imaging conditions that are set at the time of imaging. An O shown on the horizontal line denotes a slice encoding corresponding to the center of a k-space in which magnetic resonance data is arranged.

For example, as shown in FIG. 13, the control unit 26 can execute a pulse sequence of controlling the gradient coil 2 so as to keep the strength of the spoiler gradient magnetic field constant, with respect to each of a plurality of slice encodings. In such case, for example, as shown in FIG. 13, the control unit 26 can executes a pulse sequence such that the strength of the rewind gradient magnetic field gradually attenuates with distance from the center of the k-space in the slice-encoding direction.

Moreover, for example, as shown in FIG. 14, the control unit 26 can execute a pulse sequence by which the strength of the spoiler gradient magnetic field and the strength of the rewind gradient magnetic field becomes the maximum with respect to a slice encoding corresponding the center of the k-space in which magnetic resonance data is arranged, among a plurality of slice encodings. In such case, for example, as shown in FIG. 14, the control unit 26 can executes a pulse sequence of controlling the gradient coil 2 such that the strength of the spoiler gradient magnetic field is equal to the strength of the rewind gradient magnetic field with respect to a slice encoding corresponding to the center of the k-space; while with respect to others than the slice encoding corresponding to the center of the k-space, the strength of the spoiler gradient magnetic field becomes larger than the strength of the rewind gradient magnetic field.

In such case, for example, as shown in FIG. 14, the control unit 26 can executes a pulse sequence such that the strengths of the spoiler gradient magnetic field and the rewind gradient magnetic field gradually attenuate with distance from the center of the k-space within a certain range including the center of the k-space, while the strengths of the spoiler gradient magnetic field and the rewind gradient magnetic field gradually increase with distance from the center of the k-space outside the certain range.

Furthermore, for example, as shown in FIG. 15, the control unit 26 can executes a pulse sequence such that the strength of the spoiler gradient magnetic field gradually attenuates with distance from the center of the k-space within a certain range in the vicinity of an end of the k-space, and the strength of the rewind gradient magnetic field gradually increases, according to the pulse sequence shown in FIG. 14.

According to each of the pulse sequence shown in FIGS. 13 to 15, the strengths of the spoiler gradient magnetic field and the rewind gradient magnetic field are kept equal to or higher than a predetermined value (≠0), with respect to each of a plurality of slice encodings. In this way, the MRI apparatus according to the embodiments can use various pulse sequences on condition that the pulse sequence can keep the strengths of a spoiler gradient magnetic field and a rewind gradient magnetic field equal to or higher than a predetermined value, with respect to each of a plurality of slice encodings.

Moreover, the above embodiments explain cases where a spoiler gradient magnetic field and a rewind gradient magnetic field are applied in the slice-encoding direction, however, embodiments are not limited to this. For example, a similar embodiment can be implemented in a case where a spoiler gradient magnetic field and a rewind gradient magnetic field are applied in the phase-encoding direction. In such case, for example, the control unit 26 shown in FIG. 1 executes a pulse sequence of controlling the gradient coil 2 so as to keep the strengths of the spoiler gradient magnetic field and the rewind gradient magnetic field equal to or higher than a predetermined value, with respect to each of a plurality of phase encodings.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
   a Radio Frequency (RF) pulse applying unit that applies to a subject a flip pulse for exciting spin of nuclei inside a subject body, and a flop pulse for refocusing the phase of the spin;
   a gradient magnetic-field applying unit that applies a spoiler gradient magnetic field onto the subject after the flop pulse is applied, and applies a rewind gradient magnetic field before applying the flop pulse;
   a control unit that executes a pulse sequence of controlling the gradient magnetic-field applying unit so as to keep each of strengths of the spoiler gradient magnetic field and the rewind gradient magnetic field equal to or higher than a predetermined value with respect to each of a plurality of slice encodings, when performing imaging by three-dimensional fast spin echo method; and
   an image reconstructing unit that reconstructs an image from magnetic resonance data collected by executing the pulse sequence.

2. The magnetic resonance imaging apparatus according to claim 1, wherein the gradient magnetic-field applying unit applies the spoiler gradient magnetic field and the rewind gradient magnetic field in a slice encoding direction.

3. The magnetic resonance imaging apparatus according to claim 1, wherein when a maximum strength of one of the spoiler gradient magnetic field and the rewind gradient magnetic field is less than 200% of a maximum strength of a slice-encoding gradient magnetic field, the control unit executes a pulse sequence of controlling the gradient magnetic-field applying unit so as to keep the strength of each of the spoiler gradient magnetic field and the rewind gradient magnetic field equal to or higher than a predetermined value with respect to each of a plurality of slice encodings.

4. The magnetic resonance imaging apparatus according to claim 2, wherein when a maximum strength of one of the spoiler gradient magnetic field and the rewind gradient magnetic field is less than 200% of a maximum strength of a slice-encoding gradient magnetic field, the control unit executes a pulse sequence of controlling the gradient magnetic-field applying unit so as to keep the strength of each of the spoiler gradient magnetic field and the rewind gradient magnetic field equal to or higher than a predetermined value with respect to each of a plurality of slice encodings.

5. The magnetic resonance imaging apparatus according to claim 1, wherein the control unit executes a pulse sequence of controlling the gradient magnetic-field applying unit so as to maximize the strengths of the spoiler gradient magnetic field and the rewind gradient magnetic field with respect to slice encoding corresponding to a center of a k-space in which the magnetic resonance data is arranged, among the slice encodings.

6. The magnetic resonance imaging apparatus according to claim 2, wherein the control unit executes a pulse sequence of controlling the gradient magnetic-field applying unit so as to maximize the strengths of the spoiler gradient magnetic field and the rewind gradient magnetic field with respect to slice encoding corresponding to a center of a k-space in which the magnetic resonance data is arranged, among the slice encodings.

7. The magnetic resonance imaging apparatus according to claim 3, wherein the control unit executes a pulse sequence of controlling the gradient magnetic-field applying unit so as to maximize the strengths of the spoiler gradient magnetic field and the rewind gradient magnetic field with respect to slice encoding corresponding to a center of a k-space in which the magnetic resonance data is arranged, among the slice encodings.

8. The magnetic resonance imaging apparatus according to claim 1, wherein the control unit executes a pulse sequence of controlling the gradient magnetic-field applying unit such that a strength of the spoiler gradient magnetic field is equal to a strength of the rewind gradient magnetic field with respect to slice encoding corresponding to a center of the k-space, and a strength of the spoiler gradient magnetic field is to be larger than a strength of the rewind gradient magnetic field with respect to slice encodings other than the slice encoding corresponding to the center of the k-space.

9. The magnetic resonance imaging apparatus according to claim 2, wherein the control unit executes a pulse sequence of controlling the gradient magnetic-field applying unit such that a strength of the spoiler gradient magnetic field is equal to a strength of the rewind gradient magnetic field with respect to slice encoding corresponding to a center of the k-space, and a strength of the spoiler gradient magnetic field is to be larger than a strength of the rewind gradient magnetic field with respect to slice encodings other than the slice encoding corresponding to the center of the k-space.

10. The magnetic resonance imaging apparatus according to claim 3, wherein the control unit executes a pulse sequence of controlling the gradient magnetic-field applying unit such that a strength of the spoiler gradient magnetic field is equal to a strength of the rewind gradient magnetic field with respect to slice encoding corresponding to a center of the k-space, and a strength of the spoiler gradient magnetic field is to be larger than a strength of the rewind gradient magnetic field with respect to slice encodings other than the slice encoding corresponding to the center of the k-space.

11. The magnetic resonance imaging apparatus according to claim 5, wherein the control unit executes a pulse sequence of controlling the gradient magnetic-field applying unit such that a strength of the spoiler gradient magnetic field is equal to a strength of the rewind gradient magnetic field with respect to slice encoding corresponding to a center of the k-space, and a strength of the spoiler gradient magnetic field is to be larger than a strength of the rewind gradient magnetic field with respect to slice encodings other than the slice encoding corresponding to the center of the k-space.

12. The magnetic resonance imaging apparatus according to claim 1, wherein the control unit executes a pulse sequence of controlling the gradient magnetic-field applying unit so as to keep a strength of the spoiler gradient magnetic field constant with respect to each of the slice encodings.

13. The magnetic resonance imaging apparatus according to claim 2, wherein the control unit executes a pulse sequence of controlling the gradient magnetic-field applying unit so as to keep a strength of the spoiler gradient magnetic field constant with respect to each of the slice encodings.

14. The magnetic resonance imaging apparatus according to claim 3, wherein the control unit executes a pulse sequence of controlling the gradient magnetic-field applying unit so as to keep a strength of the spoiler gradient magnetic field constant with respect to each of the slice encodings.

15. The magnetic resonance imaging apparatus according to claim 1, wherein during slice encoding in which a strength of a slice-encoding gradient magnetic field when a strength of the spoiler gradient magnetic field is zero matches with a strength of a rewind gradient magnetic field when a strength of the spoiler gradient magnetic field is constant, the control unit switches between an imaging method that a strength of the spoiler gradient magnetic field is set at zero and an imaging method that a strength of the spoiler gradient magnetic field is set at a constant value, thereby keeping strengths of the spoiler gradient magnetic field and the rewind gradient magnetic field equal to or higher than a predetermined value.

16. The magnetic resonance imaging apparatus according to claim 2, wherein during slice encoding in which a strength of a slice-encoding gradient magnetic field when a strength of the spoiler gradient magnetic field is zero matches with a strength of a rewind gradient magnetic field when a strength of the spoiler gradient magnetic field is constant, the control unit switches between an imaging method that a strength of the spoiler gradient magnetic field is set at zero and an imaging method that a strength of the spoiler gradient magnetic field is set at a constant value, thereby keeping strengths of the spoiler gradient magnetic field and the rewind gradient magnetic field equal to or higher than a predetermined value.

17. The magnetic resonance imaging apparatus according to claim 3, wherein during slice encoding in which a strength of a slice-encoding gradient magnetic field when a strength of the spoiler gradient magnetic field is zero matches with a strength of a rewind gradient magnetic field when a strength of the spoiler gradient magnetic field is constant, the control unit switches between an imaging method that a strength of the spoiler gradient magnetic field is set at zero and an imaging method that a strength of the spoiler gradient magnetic field is set at a constant value, thereby keeping strengths of the spoiler gradient magnetic field and the rewind gradient magnetic field equal to or higher than a predetermined value.

18. The magnetic resonance imaging apparatus according to claim 1, wherein
the control unit performs control so as to execute a prescan of collecting magnetic resonance data of slice encoding in which a strength of one of the spoiler gradient magnetic field and the rewind gradient magnetic field in the pulse sequence of the three-dimensional fast spin echo method without applying the flip pulse, and
the image reconstructing unit performs subtraction processing of subtracting magnetic resonance data collected by the prescan from magnetic resonance data collected through the pulse sequence of the three-dimensional fast spin echo method, and reconstructs an image from data obtained through the subtraction processing.

19. The magnetic resonance imaging apparatus according to claim 2, wherein
the control unit performs control so as to execute a prescan of collecting magnetic resonance data of slice encoding in which a strength of one of the spoiler gradient magnetic field and the rewind gradient magnetic field in the pulse sequence of the three-dimensional fast spin echo method without applying the flip pulse, and
the image reconstructing unit performs subtraction processing of subtracting magnetic resonance data collected by the prescan from magnetic resonance data collected through the pulse sequence of the three-dimensional fast spin echo method, and reconstructs an image from data obtained through the subtraction processing.

20. The magnetic resonance imaging apparatus according to claim 3, wherein the control unit performs control so as to execute a prescan of collecting magnetic resonance data of slice encoding in which a strength of one of the spoiler gradient magnetic field and the rewind gradient magnetic field in the pulse sequence of the three-dimensional fast spin echo method without applying the flip pulse, and the image reconstructing unit performs subtraction processing of subtracting magnetic resonance data collected by the prescan from magnetic resonance data collected through the pulse sequence of the three-dimensional fast spin echo method, and reconstructs an image from data obtained through the subtraction processing.

\* \* \* \* \*